(12) United States Patent
Gu (10) Patent No.: US 11,804,829 B2
(45) Date of Patent: Oct. 31, 2023

(54) LATCH CIRCUIT, LATCH METHOD, AND ELECTRONIC DEVICE

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/648,145

(22) Filed: Jan. 17, 2022

(65) Prior Publication Data

US 2023/0015237 A1 Jan. 19, 2023

Related U.S. Application Data

(63) Continuation of application No. PCT/CN2021/120145, filed on Sep. 24, 2021.

(30) Foreign Application Priority Data

Jul. 19, 2021 (CN) .......................... 202110815241.1

(51) Int. Cl.
*H03K 3/02* (2006.01)
*H03K 3/356* (2006.01)
(Continued)

(52) U.S. Cl.
CPC ............... *H03K 3/356* (2013.01); *G06F 1/04* (2013.01); *H03K 19/20* (2013.01)

(58) Field of Classification Search
CPC .......... H03K 3/02; H03K 3/027; H03K 3/037; H03K 3/0372; H03K 3/0375; H03K 3/353; H03K 3/356; H03K 3/356008; H03K 3/356017; H03K 3/356026; H03K 3/356052; H03K 3/356086;
(Continued)

(56) References Cited

U.S. PATENT DOCUMENTS

| 5,095,225 A | 3/1992 | Usui |
| 10,763,834 B2 | 9/2020 | Shin |
| 11,120,846 B2 * | 9/2021 | Kim ................. H03K 17/04206 |

FOREIGN PATENT DOCUMENTS

| CN | 109379061 A | 2/2019 |
| CN | 111030674 A | 4/2020 |

(Continued)

OTHER PUBLICATIONS

International Search Report cited in PCT/CN2021/120145 dated Feb. 28, 2022, 10 pages.

*Primary Examiner* — Long Nguyen
(74) *Attorney, Agent, or Firm* — Cooper Legal Group, LLC (57) ABSTRACT

The present disclosure relates to a latch circuit and a latch method, and an electronic device, and relates to the technical field of integrated circuits. The latch circuit includes: a transmission module, a latch module, and a control module, wherein the transmission module is configured to transmit an input signal to the latch module; the latch module is configured to latch the input signal or output the input signal when a set signal or a reset signal is at a low level; and the control module is configured to perform control, such that a current leakage path cannot be formed between the transmission module and the latch module when the set signal or the reset signal is at a high level.

14 Claims, 4 Drawing Sheets

(51) Int. Cl.
*H03K 19/20* (2006.01)
*G06F 1/04* (2006.01)

(58) Field of Classification Search
CPC ....... H03K 3/356095; H03K 3/356104; H03K 3/356113; H03K 3/356123; H03K 3/356147; H03K 3/356156; H03K 3/3562; H03K 3/35625; H03K 19/20; G06F 1/04; G06F 1/10; G06F 1/12
See application file for complete search history.

(56) References Cited

FOREIGN PATENT DOCUMENTS

| | | | | |
|---|---|---|---|---|
| CN | 111092612 A | | 5/2020 | |
| JP | 2007221507 A | * | 8/2007 | ............. H03K 3/356 |
| JP | 2007221507 A | | 8/2007 | |

\* cited by examiner

LATCH CIRCUIT, LATCH METHOD, AND ELECTRONIC DEVICE

CROSS-REFERENCE TO RELATED APPLICATIONS

This is a continuation of International Application No. PCT/CN2021/120145, filed on Sep. 24, 2021, which claims the priority to Chinese Patent Application No. 202110815241.1, titled "LATCH CIRCUIT, LATCH METHOD, AND ELECTRONIC DEVICE" and filed with the China National Intellectual Property Administration (CNIPA) on Jul. 19, 2021. The entire contents of International Application No. PCT/CN2021/120145 and Chinese Patent Application No. 202110815241.1 are incorporated herein by reference.

TECHNICAL FIELD

The present disclosure relates to, but is not limited to, a latch circuit, a latch method, and an electronic device.

BACKGROUND

A latch circuit is a logic element that has a memory function in a digital circuit and can temporarily store a signal to maintain a particular level state, for example, record binary digital signals "0" and "1" in the digital circuit.

When a set signal or a reset signal is at a low level, the latch circuit can usually transmit data or perform latching normally. However, when the set signal or reset signal is at a high level, the latch circuit often generates a current leakage path, leading to power consumption.

It should be noted that information disclosed in the foregoing background part is used merely for a better understanding of the background of the present disclosure, and therefore may include information that does not constitute the prior art known to those of ordinary skill in the art.

SUMMARY

An overview of the subject matter detailed in the present disclosure is provided below, which is not intended to limit the protection scope of the claims.

An objective of the present disclosure is to provide a latch circuit, a latch method, and an electronic device.

According to a first aspect of the present disclosure, a latch circuit is provided, including: a transmission module, a latch module, and a control module, wherein the transmission module is configured to transmit an input signal to the latch module;

the latch module is configured to latch the input signal or output the input signal when a set signal or a reset signal is at a low level; and the control module is configured to perform control, such that a current leakage path cannot be formed between the transmission module and the latch module when the set signal or the reset signal is at a high level.

According to a second aspect of the present disclosure, a latch method of a latch circuit is provided, the method is applied to the latch circuit, and the latch circuit includes: a transmission module, a latch module, and a control module. The method includes:

transmitting an input signal to the latch module through the transmission module; and when a set signal or a reset signal is at a low level, latching the input signal or outputting the input signal by using the latch module; and when the set signal or the reset signal is at a high level, performing control by using the control module, such that a current leakage path cannot be formed between the transmission module and the latch module.

According to a third aspect of the present disclosure, an electronic device is provided, including the foregoing latch circuit.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A latch is a logic element having a memory function. A state of an output terminal thereof does not change with a state of an input terminal. An input state is saved to the output only when there is a latch signal, and there is no change until a next latch signal arrives.

Figure 1:
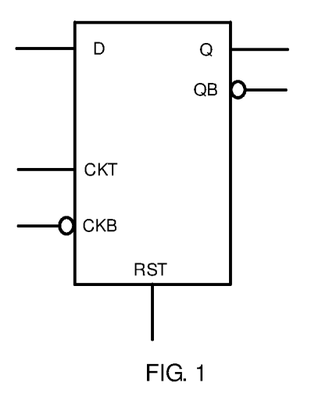
FIG. 1 is a schematic structural diagram of a logical symbol of a latch according to an exemplary implementation of the present disclosure.
Figure 2:
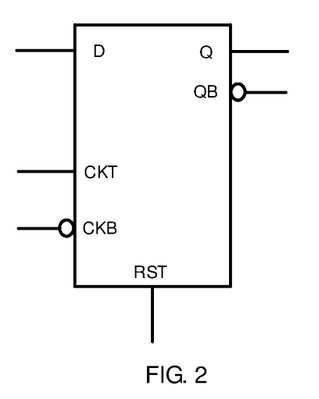
FIG. 2 is a schematic structural diagram of a logical symbol of another latch according to an exemplary implementation of the present disclosure.

FIG. 1 and FIG. 2 shows logical symbols of two types of latches. It can be learned from FIG. 1 and FIG. 2 that the two types of latches are each a latch D, and the latch is controlled by using two clock signals CKT and CKB that are opposite to each other to latch an input signal D or output signals Q and QB that are opposite to each other. The input signal D may be a digital signal, and the latch may be configured to latch or output the digital signal.

A difference lies in that a latch signal of the latch in FIG. 1 is a reset signal RST, and a latch signal of the latch in FIG. 2 is a set signal SET. When the reset signal RST or the set signal SET is at a low level, a latching or output function of the latch can normally work; when the reset signal RST or the set signal SET is at a high level, Q is forcibly output at the low level when being output.

However, the latch usually has a problem that when the reset signal RST or the set signal SET is at the high level, the input signal D, and the clock signals CKT and CKB are indeterminate, which may lead to a possibility of generating a current leakage path in the latch, thus causing occurrence of current leakage, resulting in power consumption and even a functional failure of the latch.

Figure 3:
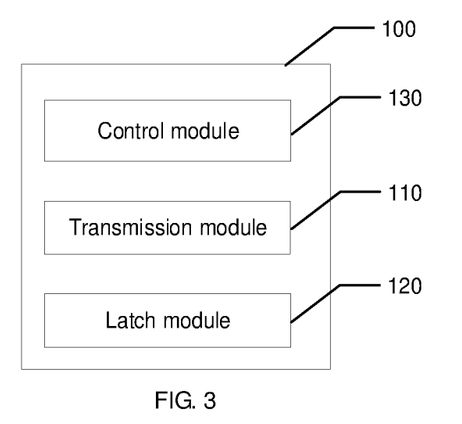
FIG. 3 is an architectural diagram of a latch circuit according to an exemplary implementation of the present disclosure.

Based on this, an exemplary implementation of the present disclosure provides a latch circuit. Referring to FIG. 3, a latch circuit 100 provided in an exemplary implementation of the present disclosure may mainly include: a transmission module 110, a latch module 120, and a control module 130.

The transmission module 110 may be configured to transmit an input signal D to the latch module 120. The latch module 120 may be configured to latch the input signal D or output the input signal D when a set signal SET or a reset signal RST is at a low level. The control module 130 may be configured to perform control, such that a current leakage path cannot be formed between the transmission module 110 and the latch module 120 when the set signal SET or the reset signal RST is at a high level.

According to the provided latch circuit, when the set signal SET or the reset signal RST is at the low level, the latch circuit may normally latch the input signal, or may output the latched signal according to a requirement. Especially when the set signal SET or the reset signal RST is at the high level, the control module can avoid forming the current leakage path between the transmission module and the latch module, thereby avoiding current leakage, reducing power consumption, and further avoiding the functional failure of the latch circuit due to the current leakage.

In an exemplary implementation of the present disclosure, in a process in which the control module 130 performs controlling, such that the current leakage path cannot be formed between the transmission module 110 and the latch module 120, there may be a plurality of manners. For example, when the set signal SET or the reset signal RST is at the high level, the transmission module 110 is turned off, to avoid forming the current leakage path between the transmission module 110 and the latch module 120. Alternatively, when the reset signal RST is at the high level, the input signal D is controlled to be at the low level; when the set signal SET is at the high level, the input signal D is controlled to be at the high level, such that an objective of avoiding forming the current leakage path between the transmission module 110 and the latch module 120 can also be achieved.

In the following, a latch circuit controlled by dual clock signals CKT and CKB is mainly used as an example to describe in detail an internal structure and a working principle of the latch circuit provided in the present disclosure. Other latch circuits controlled by a single clock signal or multiple clock signals can be implemented by reference.

Figure 4:
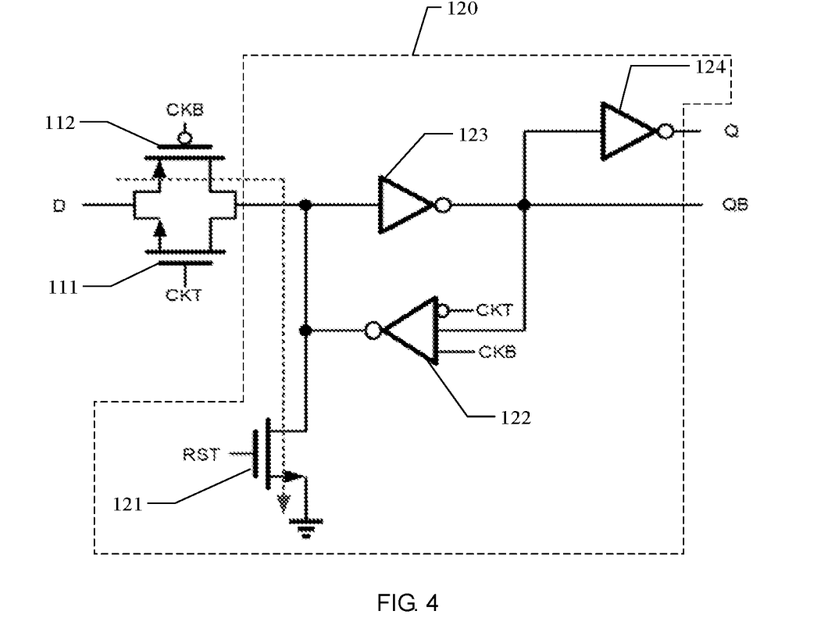
FIG. 4 is a schematic structural diagram of a latch circuit according to an exemplary implementation of the present disclosure.
Figure 5:
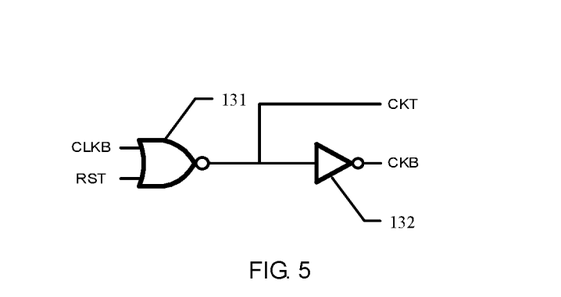
FIG. 5 is a schematic structural diagram of a control module in the latch circuit shown in FIG. 4.

Implementation 1:

Referring to FIG. 4 and FIG. 5, in a latch circuit provided in an exemplary implementation of the present disclosure, a transmission module 110 includes a first NMOS transistor 111 and a first PMOS transistor 112 connected in parallel. In addition, the first NMOS transistor 111 is controlled by a first clock signal CKT, and the first PMOS transistor 112 is controlled by a second clock signal CKB that is opposite to the first clock signal CKT. An input signal D may be transmitted to a latch module 120 through the transmission module 110. In FIG. 4, the latch module 120 connected to the transmission module 110 includes a reset portion 121 and a first latch portion, and the first latch portion includes: a first enable inverter 122, and a fifth inverter 123 and a sixth inverter 124 connected in series. An output terminal of the sixth inverter 124 outputs an output signal Q of the latch circuit. In addition, an input terminal of the first enable inverter 122 is connected to an output terminal of the fifth inverter 123; and an output terminal of the first enable inverter 122 is connected to an input terminal of the fifth inverter 123. In other words, the first enable inverter 122 and the fifth inverter 123 are also connected in series.

In addition, the reset portion 121 mainly includes a second NMOS transistor coupled between the first latch portion and a terminal of a ground voltage, and receives a reset signal RST by using a gate of the second NMOS transistor. Specifically, the second NMOS transistor is coupled between the input terminal of the fifth inverter 123 of the first latch portion and the terminal of a ground voltage. Usually, the reset signal RST has two types of logical level states, namely, a high level and a low level.

For the latch circuit including only the transmission module 110 and the latch module 120 shown in FIG. 4, when the reset signal RST is at the low level, the second NMOS transistor of the reset portion 121 is in an off state, and a circuit herein is not conducted. Therefore, when the first clock signal CKT is at the high level and the second clock signal CKB is at the low level, because an output terminal of the transmission module 110 is connected to the input terminal of the fifth inverter 123, the input signal D may be directly transmitted to the fifth inverter 123 through the transmission module 110, then transmitted to the sixth inverter 124 through the fifth inverter 123, and finally given to the output signal Q of the sixth inverter 124, that is, Q=D.

When the reset signal RST is at the low level, the corresponding second NMOS transistor is in an off state. When the first clock signal CKT is at the low level and the second clock signal CKB is at the high level, the transmission module 110 is in an off state. In addition, because the first enable inverter 122 enabled by the first clock signal CKT and the second clock signal CKB is in an on state when the first clock signal CKT is at the low level and the second clock signal CKB is at the high level, the latch module 120 in this case is mainly configured to perform latching to maintain a D value in a previous state, to achieve an objective of latching the input signal D.

When the reset signal RST is at the high level, because the second NMOS transistor of the reset portion 121 is grounded, the output signal Q is directly forcibly output at the low level. However, a value of the output signal Q is not affected by the input signal D in this state. Therefore, the input signal D, the first clock signal CKT, and the second clock signal CKB in this case are indeterminate, and a possible case may exist, that is, when the input signal D is at the high level, the first clock signal CKT is at the high level, and the second clock signal CKB is at the low level, a current leakage path shown by a dotted line arrow in FIG. 4 is formed between the transmission module 110 and the reset portion 121, and the input signal D input through the input terminal causes occurrence of current leakage along the current leakage path, resulting in power consumption and even a functional failure of the latch circuit.

Therefore, to avoid forming the current leakage path, as shown in FIG. 5, a control module 130 provided in an exemplary implementation of the present disclosure includes a first NOR gate 131 and a first inverter 132, wherein an input terminal of the first NOR gate 131 accesses a reset signal RST, and the input terminal of the first NOR gate 131 may further access another clock signal CLKB. After these two signals pass through the first NOR gate 131, an output terminal of the first NOR gate 131 outputs a first clock signal CKT. An input terminal of the first inverter 132 is connected to the output terminal of the first NOR gate 131, and an output terminal of the first inverter 132 outputs a second clock signal CKB.

It can be learned from a circuit diagram of the control module 130 shown in FIG. 5 that when the reset signal RST is at a high level, the first NOR gate 131 outputs a low level. In other words, the first clock signal CKT in this case is at the low level and the second clock signal CKB is at the high level. In addition, when the first clock signal CKT is at the low level and the second clock signal CKB is at the high level, a transmission module 110 is in an off state. In other words, the control module 130 shown in FIG. 5 may be used to turn off the transmission module 110, to avoid forming a current leakage path between the transmission module 110 and a latch module 120, thereby avoiding current leakage.

In addition, for the latch circuit formed by FIG. 4 and FIG. 5, when the reset signal RST is at a low level, if the clock signal CLKB is at a low level, a high level is output after the two low levels pass through the first NOR gate 131. That is, the first clock signal CKT is at the high level and the second clock signal CKB is at the low level in this case. When the first clock signal CKT is at a high level and the second clock signal CKB is at a low level, the transmission module 110 is in an on state, the first enable inverter 122 in this case is in an off state, and the latch module 120 may directly give the input signal D to the output signal Q.

When the reset signal RST is at a low level, if the clock signal CLKB is at a high level, a low level is output after the two signals pass through the first NOR gate 131. That is, the first clock signal CKT is at the low level and the second clock signal CKB is at the high level in this case. When the first clock signal CKT is at a low level and the second clock signal CKB is at a high level, the transmission module 110 is in an off state, the first enable inverter 122 in this case is in an on state, and the latch module 120 may perform latching to maintain a D value in a previous state, to achieve an objective of latching the input signal D.

It can be learned that the latch circuit formed by FIG. 4 and FIG. 5 may have a function of normally outputting the input signal D or latching the input signal D when the reset signal RST is at the low level, and may further turn off the transmission module 110 when the reset signal RST is at the high level, to avoid forming the current leakage path, thereby achieving an objective of avoiding current leakage and reducing power consumption.

Figure 6:
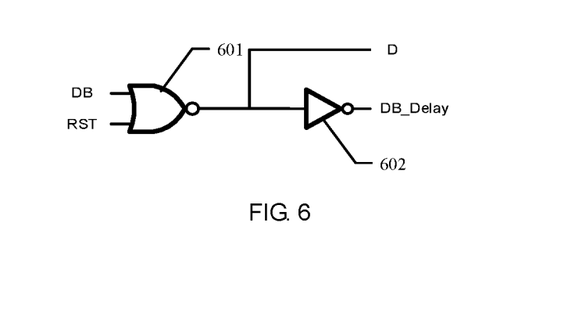
FIG. 6 is a schematic structural diagram of another control module in the latch circuit shown in FIG. 4.

Implementation 2:

For the problem that the current leakage path exists between the transmission module 110 and the latch module 120 shown in FIG. 4, an exemplary implementation of the present disclosure further provides another control module. Referring to FIG. 6, the control module 130 includes a third NOR gate 601 and a third inverter 602, wherein an input terminal of the third NOR gate 601 accesses a reset signal RST, and the input terminal of the third NOR gate 601 may further access another inverted data transmission signal DB. After these two signals pass through the third NOR gate 601, an output terminal of the third NOR gate 601 outputs an input signal D used to be input to the transmission module 110. An input terminal of the third inverter 602 is connected to the output terminal of the third NOR gate 601, and an output terminal of the third inverter 602 outputs an inverted data delay transmission signal DB_Delay.

It can be learned from a circuit diagram of the control module 130 shown in FIG. 6 that when the reset signal RST is at a high level, the third NOR gate 601 outputs a low level. In other words, the input signal D in this case is at a low level VSS. Even if a first clock signal CKT is at a high level, a second clock signal CKB is at a low level, and the transmission module 110 in an on state in this case, because the input signal D input by the transmission module 110 is at the low level VSS, a current leakage path is not formed between the transmission module 110 and a reset portion 121, thereby avoiding forming a current leakage path between the transmission module 110 and the latch module 120. This may also avoid current leakage.

In addition, for the latch circuit formed by FIG. 4 and FIG. 6, when the reset signal RST is at a low level, if the inverted data transmission signal DB is at a low level, a high level is output after the two low levels pass through the third NOR gate 601. That is, the input signal D in this case is at the high level. Whether the latch module 120 directly gives the input signal D to the output signal Q or latches the input signal D may be determined depending on whether the transmission module 110 is in an on state or an off state.

When the reset signal RST is at a low level, if the inverted data transmission signal DB is at a high level, a low level is output after the two signals pass through the third NOR gate 601. That is, the input signal D in this case is at the low level. Whether the latch module 120 directly gives the input signal D to the output signal Q or latches the input signal D may be determined depending on whether the transmission module 110 is in an on state or an off state.

It can be learned that the latch circuit formed by FIG. 4 and FIG. 6 may have a function of normally outputting the input signal D or latching the input signal D when the reset signal RST is at the low level, and may further control the input signal D to be at the low level when the reset signal RST is at the high level, to avoid forming the current leakage path, thereby achieving an objective of avoiding current leakage and reducing power consumption.

Figure 7:
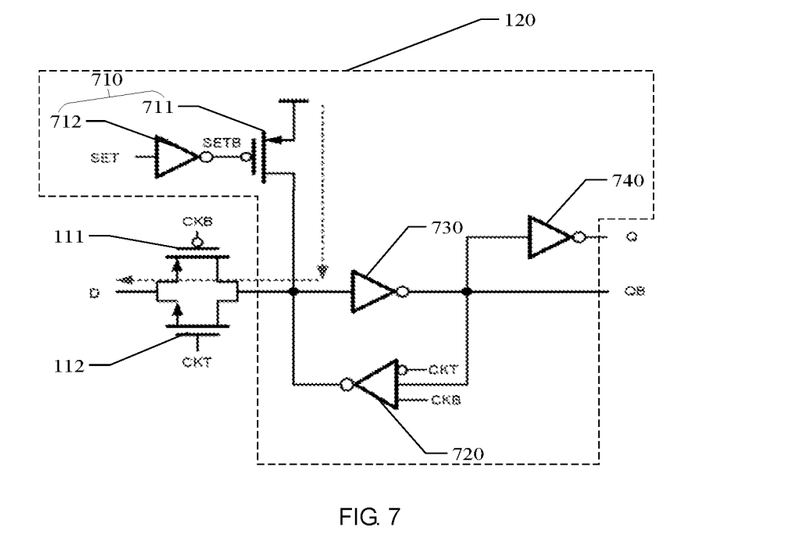
FIG. 7 is a schematic structural diagram of another latch circuit according to an exemplary implementation of the present disclosure.
Figure 8:
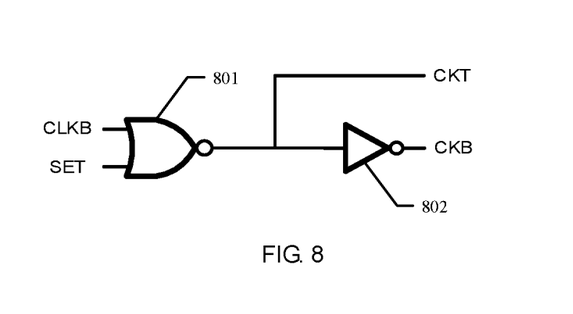
FIG. 8 is a schematic structural diagram of a control module in the latch circuit shown in FIG. 7.

Implementation 3:

Referring to FIG. 7 and FIG. 8, in a latch circuit provided in an exemplary implementation of the present disclosure, a transmission module 110 includes a first NMOS transistor 111 and a first PMOS transistor 112 connected in parallel. In addition, the first NMOS transistor 111 is controlled by a first clock signal CKT, and the first PMOS transistor 112 is controlled by a second clock signal CKB that is opposite to the first clock signal CKT. An input signal D may be transmitted to a latch module 120 through the transmission module 110. In FIG. 7, the latch module 120 connected to the transmission module 110 includes a set portion 710 and a second latch portion, and the second latch portion includes: a second enable inverter 720, and a seventh inverter 730 and an eighth inverter 740 connected in series. An output terminal of the eighth inverter 740 outputs an output signal Q of the latch circuit. In addition, an input terminal of the second enable inverter 720 is connected to an output terminal of the seventh inverter 730; and an output terminal of the second enable inverter 720 is connected to an input terminal of the seventh inverter 730. In other words, the second enable inverter 720 and the seventh inverter 730 are also connected in series.

In addition, the set portion 710 mainly includes a second PMOS transistor 711 coupled between a terminal of a power supply voltage and the second latch portion, and receives an inverted signal of the set signal SET through a gate of the second PMOS transistor 711. Specifically, the set signal SET is inverted by providing a set signal inverter 712 at the gate of the second PMOS transistor 711. In addition, the second PMOS transistor 711 is specifically coupled between the terminal of the power supply voltage and the input terminal of the seventh inverter 730 of the second latch portion. Usually, the set signal SET has two types of logical level states, namely, a high level and a low level.

For the latch circuit including only the transmission module 110 and the latch module 120 shown in FIG. 7, when the set signal SET is at the low level, the second PMOS transistor 711 of the set portion 710 is in an off state, and a circuit herein is not conducted. Therefore, when the first clock signal CKT is at the high level and the second clock signal CKB is at the low level, because an output terminal of the transmission module 110 is connected to the input terminal of the seventh inverter 730, the input signal D may be directly transmitted to the seventh inverter 730 through the transmission module 110, then transmitted to the eighth inverter 740 through the seventh inverter 730, and finally given to the output signal Q of the eighth inverter 740, that is, Q=D.

When the set signal SET is at the low level, the corresponding second PMOS transistor 711 is in an off state. When the first clock signal CKT is at the low level and the second clock signal CKB is at the high level, the transmission module 110 is in an off state. In addition, because the second enable inverter 720 enabled by the first clock signal CKT and the second clock signal CKB is in an on state when the first clock signal CKT is at the low level and the second clock signal CKB is at the high level, the latch module 120 in this case is mainly configured to perform latching to maintain a D value in a previous state, to achieve an objective of latching the input signal D.

When the set signal SET is at the high level, because the second PMOS transistor 711 of the set portion 710 is connected to a power supply, the output signal Q is directly forcibly output at the high level. However, a value of the output signal Q is not affected by the input signal D in this state. Therefore, the input signal D, the first clock signal CKT, and the second clock signal CKB in this case are indeterminate, and a possible case may exist, that is, when the input signal D is at the low level, the first clock signal CKT is at the high level, and the second clock signal CKB is at the low level, a current leakage path shown by a dotted line arrow in FIG. 7 is formed between the transmission module 110 and the set portion 710, and a power supply signal causes occurrence of current leakage along the current leakage path, resulting in power consumption and even a functional failure of the latch circuit.

Therefore, to avoid forming the current leakage path, as shown in FIG. 8, a control module 130 provided in an exemplary implementation of the present disclosure includes a second NOR gate 801 and a second inverter 802, wherein an input terminal of the second NOR gate 801 accesses a set signal SET, and the input terminal of the second NOR gate 801 may further access another clock signal CLKB. After these two signals pass through the second NOR gate 801, an output terminal of the second NOR gate 801 outputs a first clock signal CKT. An input terminal of the second inverter 802 is connected to the output terminal of the second NOR gate 801, and an output terminal of the second inverter 802 outputs a second clock signal CKB.

It can be learned from a circuit diagram of the control module 130 shown in FIG. 8 that when the set signal SET is at a high level, the second NOR gate 801 outputs a low level. In other words, the first clock signal CKT in this case is at the low level and the second clock signal CKB is at the high level. In addition, when the first clock signal CKT is at the low level and the second clock signal CKB is at the high level, a transmission module 110 is in an off state. In other words, the control module 130 shown in FIG. 8 may be used to turn off the transmission module 110, to avoid forming a current leakage path between the transmission module 110 and a latch module 120, thereby avoiding current leakage.

In addition, for the latch circuit formed by FIG. 7 and FIG. 8, when the set signal SET is at a low level, the set portion 710 is turned off. If the clock signal CLKB is at a low level, a high level is output after the two low levels pass through the second NOR gate 801. That is, the first clock signal CKT is at the high level and the second clock signal CKB is at the low level in this case. When the first clock signal CKT is at a high level and the second clock signal CKB is at a low level, the transmission module 110 is in an on state, the second enable inverter 720 in this case is in an off state, and the latch module 120 may directly give the input signal D to the output signal Q.

When the set signal SET is at a low level, the set portion 710 is turned off. If the clock signal CLKB is at a high level, a low level is output after the two signals pass through the second NOR gate 801. That is, the first clock signal CKT is at the low level and the second clock signal CKB is at the high level in this case.

When the first clock signal CKT is at a low level and the second clock signal CKB is at a high level, the transmission module 110 is in an off state, the second enable inverter 720 in this case is in an on state, and the latch module 120 may perform latching to maintain a D value in a previous state, to achieve an objective of latching the input signal D.

It can be learned that the latch circuit formed by FIG. 7 and FIG. 8 may have a function of normally outputting the input signal D or latching the input signal D when the set signal SET is at the low level, and may further turn off the transmission module 110 when the set signal SET is at the high level, to avoid forming the current leakage path, thereby achieving an objective of avoiding current leakage and reducing power consumption.

Figure 9:
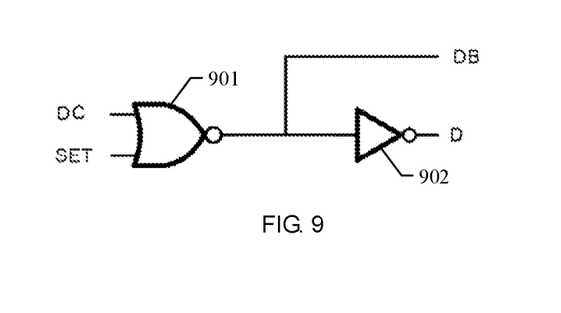
FIG. 9 is a schematic structural diagram of another control module in the latch circuit shown in FIG. 7.

Implementation 4:

For the problem that the current leakage path exists between the transmission module 110 and the latch module 120 shown in FIG. 7, an exemplary implementation of the present disclosure further provides another control module. Referring to FIG. 9, the control module 130 includes a fourth NOR gate 901 and a fourth inverter 902, wherein an input terminal of the fourth NOR gate 901 accesses a set signal SET, and the input terminal of the fourth NOR gate 901 may further access another signal DC, wherein the signal DC may be an original input signal D. After the two signals pass through the fourth NOR gate 901, an output terminal of the fourth NOR gate 901 outputs, through the fourth inverter 902, a changed input signal D to be input to the transmission module 110. An input terminal of the fourth inverter 902 is connected to the output terminal of the fourth NOR gate 901, and an output terminal of the fourth inverter 902 outputs an inverted data transmission signal DB.

It can be learned from a circuit diagram of the control module 130 shown in FIG. 9 that when the set signal SET is at a high level, the fourth NOR gate 901 outputs a low level, and the input signal D in this case is at a high level VDD after passing through the fourth inverter 902. Even if a first clock signal CKT is at a high level, a second clock signal CKB is at a low level, and the transmission module 110 in an on state in this case, because the input signal D input by the transmission module 110 is at the high level VDD, a current leakage path is not formed between the transmission module 110 and a set portion 710, thereby avoiding forming a current leakage path between the transmission module 110 and the latch module 120. This may also avoid current leakage.

In addition, for the latch circuit formed by FIG. 7 and FIG. 9, when the set signal SET is at a low level, the set portion 710 is turned off. If the signal DC is at a low level, a high level is output after the two low levels pass through the fourth NOR gate 901, and the input signal D in this case is at a low level after passing through the fourth inverter 902. Whether the latch module 120 directly gives the input signal D to the output signal Q or latches the input signal D may be determined depending on whether the transmission module 110 is in an on state or an off state.

When the set signal SET is at a low level, the set portion 710 is turned off. If the signal DC is at a high level, a low level is output after these two signals pass through the fourth NOR gate 901, and the input signal D in this case is at a high level after passing through the fourth inverter 902. Whether the latch module 120 directly gives the input signal D to the output signal Q or latches the input signal D may be determined depending on whether the transmission module 110 is in an on state or an off state.

It can be learned that the latch circuit formed by FIG. 7 and FIG. 9 may have a function of normally outputting the input signal D or latching the input signal D when the set signal SET is at the low level, and may further control the input signal D to be at the high level when the set signal SET is at the high level, to avoid forming the current leakage path, thereby achieving an objective of avoiding current leakage and reducing power consumption.

It can be learned with reference to the foregoing four implementations that, in the latch circuit provided in the exemplary implementations of the present disclosure, the control module is used to control the input signal or the clock signal that needs to be input, such that when the set signal or the reset signal is at a high level, a current leakage path cannot be formed between the transmission module and the latch module through controlling, thereby avoiding occurrence of current leakage in this case, and achieving an objective of reducing power consumption. In addition, for the input signal or the clock signal processed through the control module, when the set signal or the reset signal is at a low level, the input signal D can be normally output or the input signal D can be normally latched, which has no impact on a function of the latch circuit.

Figure 10:
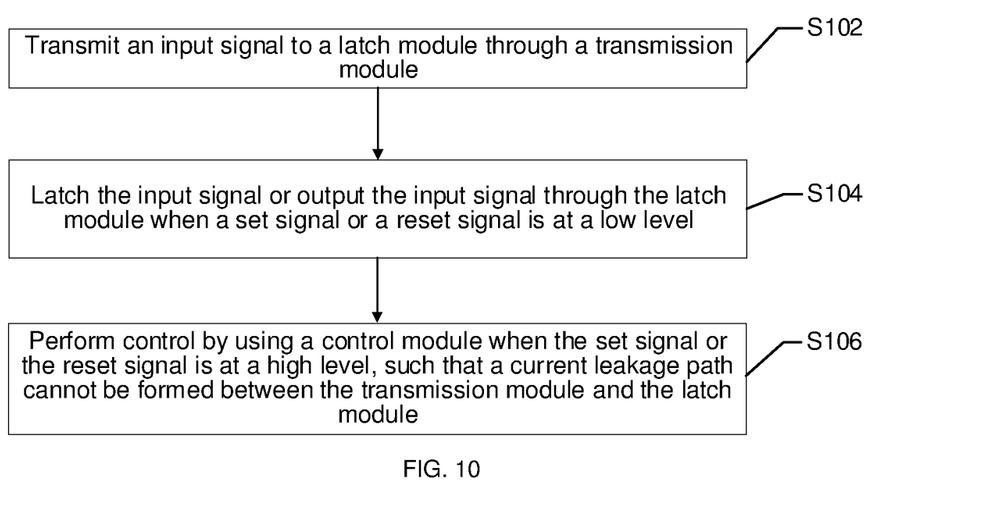
FIG. 10 is a flowchart of a latch method of a latch circuit according to an exemplary implementation of the present disclosure.

An exemplary implementation of the present disclosure further provides a latch method of a latch circuit, applied to the foregoing latch circuit. The latch circuit includes: a transmission module, a latch module, and a control module. Referring to FIG. 10, the latch method may specifically include the following steps:

Step S102. Transmit an input signal to the latch module through the transmission module.

Step S104. When the set signal or the reset signal is at a low level, latch the input signal or output the input signal through the latch module.

Step S106. When the set signal or the reset signal is at a high level, perform control by using the control module, such that a current leakage path cannot be formed between the transmission module and the latch module.

In some embodiments of the present disclosure, performing control by using the control module, such that the current leakage path cannot be formed between the transmission module and the latch module includes: turning off the transmission module by using the control module, such that the current leakage path cannot be formed between the transmission module and the latch module.

In some embodiments of the present disclosure, the transmission module includes: a first NMOS transistor controlled by a first clock signal, and a first PMOS transistor controlled by a second clock signal that is opposite to the first clock signal; and the performing control by using the control module, such that the current leakage path cannot be formed between the transmission module and the latch module includes: changing the first clock signal by using the control module, to turn off the transmission module.

In some embodiments of the present disclosure, and transmission module includes: a first NMOS transistor controlled by a first clock signal, and a first PMOS transistor controlled by a second clock signal that is opposite to the first clock signal; and the performing control by using the control module, such that the current leakage path cannot be formed between the transmission module and the latch module includes: changing the input signal to be at a low level by using the control module, such that the current leakage path cannot be formed between the transmission module and the latch module.

Specific details of each step in the latch method of the foregoing latch circuit have been described in detail in the corresponding latch circuit, and therefore are not repeated herein again.

An exemplary implementation of the present disclosure further provide an electronic device, and the electronic device may include: the foregoing latch circuit. A specific structural form and a working principle of the latch circuit have been described in detail in the foregoing embodiments, and details are not described herein again.

The foregoing embodiments may be implemented in whole or in part by software, hardware, firmware, or any combination thereof. When a software program is used for implementation, the implementation can be performed in a form of a computer program product in whole or in part. The computer program product includes one or more computer instructions. When the computer program instructions are loaded and executed on a computer, the procedures or functions according to the embodiments of the present disclosure are all or partially generated. The computer may be a general-purpose computer, a dedicated computer, a computer network, or another programmable device. The computer instructions may be stored in a computer-readable storage medium, or may be transmitted from one computer-readable storage medium to another computer-readable storage medium. The computer-readable storage medium may be any usable medium accessible by a computer, or a data storage device, such as a server or a data center, integrating one or more usable media. The usable medium may be a magnetic medium (such as a floppy disk, a hard disk, or a magnetic tape), an optical medium (such as a DVD), a semiconductor medium (such as a solid state disk (SSD)), or the like. In the embodiments of the present disclosure, the computer may include the foregoing devices.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material, or characteristic may be combined in an appropriate manner in any one or more implementations or examples.

It should be noted that in the description of the present disclosure, the terms such as "center", "top", "bottom", "left", "right", "vertical", "horizontal", "inner", and "outer" indicate the orientation or position relationships based on the accompanying drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the latch circuit provided in the present disclosure, when a set signal or a reset signal is at a low level, an input signal can be normally latched, or a latched signal can be output according to a requirement; or when a set signal or a reset signal is at a high level, the control module may be used to avoid forming a current leakage path between the transmission module and the latch module, thereby avoiding current leakage, reducing power consumption, and further avoiding a functional failure of the latch circuit due to the current leakage.

The invention claimed is:

1. A latch circuit, comprising: a transmission module, a latch module, and a control module, wherein
   the transmission module is configured to transmit an input signal to the latch module, and the transmission module comprises a first N-type metal-oxide-semiconductor (NMOS) transistor and a first P-type metal-oxide-semiconductor (PMOS) transistor connected in parallel;
   the latch module is configured to latch the input signal or output the input signal when a set signal or a reset signal is at a low level; and
   the control module is configured to perform control, such that a current leakage path cannot be formed between the transmission module and the latch module when the set signal or the reset signal is at a high level, and the control module is configured to change a first clock signal, to turn off the transmission module.

2. The circuit according to claim 1, wherein the control module comprises a first NOR gate and a first inverter, wherein
   an input terminal of the first NOR gate accesses the reset signal, and an output terminal of the first NOR gate outputs the first clock signal; and
   an input terminal of the first inverter is connected to the output terminal of the first NOR gate, and an output terminal of the first inverter outputs a second clock signal.

3. The circuit according to claim 1, wherein the control module comprises a second NOR gate and a second inverter, wherein
   an input terminal of the second NOR gate accesses the set signal, and an output terminal of the second NOR gate outputs the first clock signal; and
   an input terminal of the second inverter is connected to the output terminal of the second NOR gate, and an output terminal of the second inverter outputs a second clock signal.

4. The circuit according to claim 1, wherein the control module is configured to control the input signal to be at the low level when the reset signal is at the high level; or control the input signal to be at the high level when the set signal is at the high level, such that the current leakage path cannot be formed between the transmission module and the latch module.

5. The circuit according to claim 4, wherein the control module comprises a third NOR gate and a third inverter, wherein
   an input terminal of the third NOR gate accesses the reset signal, and an output terminal of the third NOR gate outputs the input signal; and
   an input terminal of the third inverter is connected to the output terminal of the third NOR gate, and an output terminal of the third inverter outputs an inverted data delay transmission signal.

6. The circuit according to claim 4, wherein the control module comprises a fourth NOR gate and a fourth inverter, wherein
  an input terminal of the fourth NOR gate accesses the set signal, and an output terminal of the fourth NOR gate outputs the input signal; and
  an input terminal of the fourth inverter is connected to the output terminal of the fourth NOR gate, and an output terminal of the fourth inverter outputs an inverted data transmission signal.

7. The circuit according to claim 2, wherein the latch module comprises a reset portion and a first latch portion, wherein
  the reset portion comprises a second NMOS transistor coupled between the first latch portion and a terminal of a ground voltage, and receives the reset signal by using a gate of the second NMOS transistor.

8. The circuit according to claim 7, wherein the first latch portion comprises: a first enable inverter, and a fifth inverter and a sixth inverter connected in series, wherein
  an input terminal of the first enable inverter is connected to an output terminal of the fifth inverter; and an output terminal of the first enable inverter is connected to an input terminal of the fifth inverter;
  the second NMOS transistor is coupled to the input terminal of the fifth inverter; and
  an output terminal of the transmission module is connected to the input terminal of the fifth inverter.

9. The circuit according to claim 3, wherein the latch module comprises a set portion and a second latch portion, wherein
  the set portion comprises a second PMOS transistor coupled between a terminal of a power supply voltage and the second latch portion, and receives an inverted signal of the set signal by using a gate of the second PMOS transistor.

10. The circuit according to claim 9, wherein the second latch portion comprises: a second enable inverter, and a seventh inverter and an eighth inverter connected in series, wherein
  an input terminal of the second enable inverter is connected to an output terminal of the seventh inverter; and an output terminal of the second enable inverter is connected to an input terminal of the seventh inverter;
  the second PMOS transistor is coupled to the input terminal of the seventh inverter; and
  an output terminal of the transmission module is connected to the input terminal of the seventh inverter.

11. A latch method of a latch circuit, wherein the method is applied to the latch circuit, and the latch circuit comprises: a transmission module, a latch module, and a control module; and the method comprises:
  transmitting an input signal to the latch module by using the transmission module;
  when a set signal or a reset signal is at a low level, latching the input signal or outputting the input signal by using the latch module; and
  when the set signal or the reset signal is at a high level, performing control by using the control module, such that a current leakage path cannot be formed between the transmission module and the latch module, wherein
    the transmission module comprises a first N-type metal-oxide-semiconductor (NMOS) transistor and a first P-type metal-oxide-semiconductor (PMOS) transistor connected in parallel; and
    the performing control by using the control module, such that a current leakage path cannot be formed between the transmission module and the latch module comprises: changing a first clock signal by using the control module, to turn off the transmission module, such that the current leakage path cannot be formed between the transmission module and the latch module.

12. The method according to claim 11, wherein the first NMOS transistor is controlled by the first clock signal, and the first PMOS transistor is controlled by a second clock signal that is opposite to the first clock signal.

13. The method according to claim 11, wherein the first NMOS transistor is controlled by the first clock signal, and the first PMOS transistor is controlled by a second clock signal that is opposite to the first clock signal; and
  the performing control by using the control module, such that a current leakage path cannot be formed between the transmission module and the latch module comprises: when the reset signal is at the high level, controlling the input signal to be at the low level by using the control module; or when the set signal is at the high level, controlling the input signal to be at the high level by using the control module, such that the current leakage path cannot be formed between the transmission module and the latch module.

14. An electronic device, wherein the electronic device comprises the latch circuit according to claim 1.

* * * * *